United States Patent
Cong et al.

(10) Patent No.: US 12,170,213 B2
(45) Date of Patent: Dec. 17, 2024

(54) FLAT POCKET SUSCEPTOR DESIGN WITH IMPROVED HEAT TRANSFER

(71) Applicant: Applied Materials, Inc., Santa Clara, CA (US)

(72) Inventors: Zhepeng Cong, San Jose, CA (US); Nyi Oo Myo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 840 days.

(21) Appl. No.: 17/178,204

(22) Filed: Feb. 17, 2021

(65) Prior Publication Data

US 2022/0262658 A1 Aug. 18, 2022

(51) Int. Cl.
| | |
|---|---|
| *H01L 21/67* | (2006.01) |
| *C23C 16/458* | (2006.01) |
| *H01L 21/08* | (2006.01) |
| *H01L 21/687* | (2006.01) |

(52) U.S. Cl.
CPC .... *H01L 21/67115* (2013.01); *C23C 16/4583* (2013.01); *H01L 21/68735* (2013.01)

(58) Field of Classification Search
CPC .... G06Q 10/06; G08G 5/0013; G08G 5/0026; Y02A 30/14; C23C 16/4583; H01L 21/67109; H01L 21/67115; H01L 21/67248; H01L 21/68735; H01L 21/6875
USPC ................................................. 392/316–318
See application file for complete search history.

(56) References Cited

U.S. PATENT DOCUMENTS

| | | | | |
|---|---|---|---|---|
| 5,916,370 | A | * | 6/1999 | Chang ............... H01L 21/68757 118/500 |
| 2003/0209326 | A1 | * | 11/2003 | Lee ........................ C23C 16/46 156/345.52 |
| 2010/0129990 | A1 | | 5/2010 | Nishizawa et al. |
| 2010/0163524 | A1 | | 7/2010 | Arai et al. |
| 2012/0270407 | A1 | | 10/2012 | Werner et al. |

(Continued)

FOREIGN PATENT DOCUMENTS

| | | |
|---|---|---|
| CN | 108884565 A | 11/2018 |
| EP | 1396879 A1 | 3/2004 |

(Continued)

OTHER PUBLICATIONS

International Search Report dated May 11, 2022 for Application No. PCT/US2022/013167.

(Continued)

*Primary Examiner* — Quang T Van (74) *Attorney, Agent, or Firm* — Patterson + Sheridan, LLP (57) ABSTRACT

Embodiments of the present disclosure generally relate to a susceptor for thermal processing of semiconductor substrates. In one embodiment, the susceptor includes an inner region having a pattern formed in a top surface thereof, the pattern including a plurality of substrate support features separated by a plurality of venting channels. The susceptor includes a rim surrounding and coupled to the inner region, wherein the inner region is recessed relative to the rim to form a recessed pocket configured to receive a substrate. The susceptor includes a plurality of bumps extending radially inward from an inner diameter of the rim, the plurality of bumps configured to contact an outer edge of a substrate supported by the plurality of substrate support features for positioning the substrate within the recessed pocket.

19 Claims, 6 Drawing Sheets

(56) References Cited

U.S. PATENT DOCUMENTS

| | | | |
|---|---|---|---|
| 2013/0109192 A1 | 5/2013 | Hawkins et al. |
| 2016/0111318 A1 | 4/2016 | Ichinose |
| 2016/0133504 A1 | 5/2016 | Chu et al. |
| 2017/0175265 A1 | 6/2017 | Shah et al. |

FOREIGN PATENT DOCUMENTS

| | | |
|---|---|---|
| EP | 2806311 A1 | 11/2014 |
| EP | 3626865 A1 | 3/2020 |
| JP | 2002343727 A | 11/2002 |
| JP | 2004128019 A | 4/2004 |
| JP | 2004200436 A | 7/2004 |
| JP | 2010147080 A | 7/2010 |
| JP | 2014229910 A | 12/2014 |
| KR | 10-2011-0119092 A | 11/2011 |
| TW | 201306167 A | 2/2013 |
| TW | M462941 U | 10/2013 |
| WO | 2009072252 A1 | 6/2009 |
| WO | 2020051217 A1 | 3/2020 |

OTHER PUBLICATIONS

Taiwan Office Action dated Mar. 5, 2024 for Application No. 111105761.
Japanese Office Action dated Jul. 23, 2024 for Application No. 2023-549013.
Taiwan Office Action dated Jul. 31, 2024 for Application No. 111105761.

\* cited by examiner

FLAT POCKET SUSCEPTOR DESIGN WITH IMPROVED HEAT TRANSFER

BACKGROUND

Field

Embodiments of the present disclosure generally relate to a susceptor for use in a thermal process chamber.

Description of the Related Art

Semiconductor substrates are processed for a wide variety of applications, including the fabrication of integrated devices and microdevices. During processing, the substrate is positioned on a susceptor within a process chamber. Susceptors often have platter or dish-shaped upper surfaces that are used to support the substrate from below. The susceptor is supported by a support shaft, which is rotatable about a central axis. Precise control over a heating source, such as a plurality of heating lamps disposed below the susceptor, allows a susceptor to be heated within very strict tolerances. The heated susceptor can then transfer heat to the substrate, primarily by radiation emitted by the susceptor.

Despite the precise control of heating the susceptor, it has been observed that the susceptor may cause temperature non-uniformity across the substrate due to non-uniform heat transfer between regions of the substrate in contact with the susceptor and regions of the substrate not in contact with the susceptor. Temperature non-uniformities persist across the upper surface of the substrate often reducing the quality of the layers deposited on the substrate. Undesirable temperature profiles have been observed near the edges of the substrate as well as over areas closer to the center of the substrate. Therefore, a need exists for an improved susceptor for supporting and heating substrates in semiconductor processing.

SUMMARY

Embodiments of the present disclosure generally relate to a susceptor for thermal processing of semiconductor substrates. In one embodiment, the susceptor includes an inner region having a pattern formed in a top surface thereof, the pattern including a plurality of substrate support features separated by a plurality of venting channels. The susceptor includes a rim surrounding and coupled to the inner region, wherein the inner region is recessed relative to the rim to form a recessed pocket configured to receive a substrate. The susceptor includes a plurality of bumps extending radially inward from an inner diameter of the rim, the plurality of bumps configured to contact an outer edge of a substrate supported by the plurality of substrate support features for positioning the substrate within the recessed pocket.

In another embodiment, a method of fabricating a susceptor includes forming a plurality of channels in a top surface of a recessed pocket of the susceptor, the plurality of channels having a plurality of support features formed therebetween. Forming the plurality of channels and the plurality of support features includes making a first plurality of cuts in a first direction using a cutting tool, rotating the susceptor relative to the cutting tool by a first angle and making a second plurality of cuts in a second direction using the cutting tool, the second direction spaced from the first direction by the first angle. The method includes recessing a top surface of the recessed pocket.

In yet another embodiment, the susceptor includes an inner region having a pattern formed in a top surface thereof, the pattern comprising a plurality of substrate support features separated by a plurality of venting channels. Each substrate support feature includes a substrate contact surface along the top surface of the inner region, and the substrate contact surfaces are substantially flat with respect to a lateral plane of the susceptor. The susceptor includes a rim surrounding and coupled to the inner region, wherein the inner region is recessed relative to the rim to form a recessed pocket configured to receive a substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the present disclosure generally relate to a susceptor for thermal processing of semiconductor substrates. Embodiments disclosed can improve thermal uniformity across the surface of a substrate during processing by reducing a contacting surface area between the susceptor and the substrate. Reducing the contacting surface area between the susceptor and the substrate reduces the amount of heat that is transferred from the susceptor to the substrate by conduction during processing. In some embodiments, an inner region of the susceptor includes a pattern formed in a top surface thereof, the pattern including a plurality of substrate support features separated by a plurality of venting channels. In some embodiments, each substrate support feature includes a substrate contact surface along the top surface of the inner region, and the substrate contact surfaces are substantially flat. In some embodiments, the size of each substrate contact surface is reduced to increase the number of contact points between the susceptor and the substrate while minimizing the contacting surface area. In some embodiments, the susceptor may further provide a plurality of bumps helping to radially position and/or center a substrate on the susceptor while, at the same time, reducing a contacting surface area between the substrate and the susceptor. Reducing the contacting surface area between the substrate and the susceptor can reduce a hot spot effect caused by higher than average heat transfer to the substrate at the outer edge. Details of the embodiments of the susceptor are described below.

Exemplary Chamber Hardware

Figure 1:
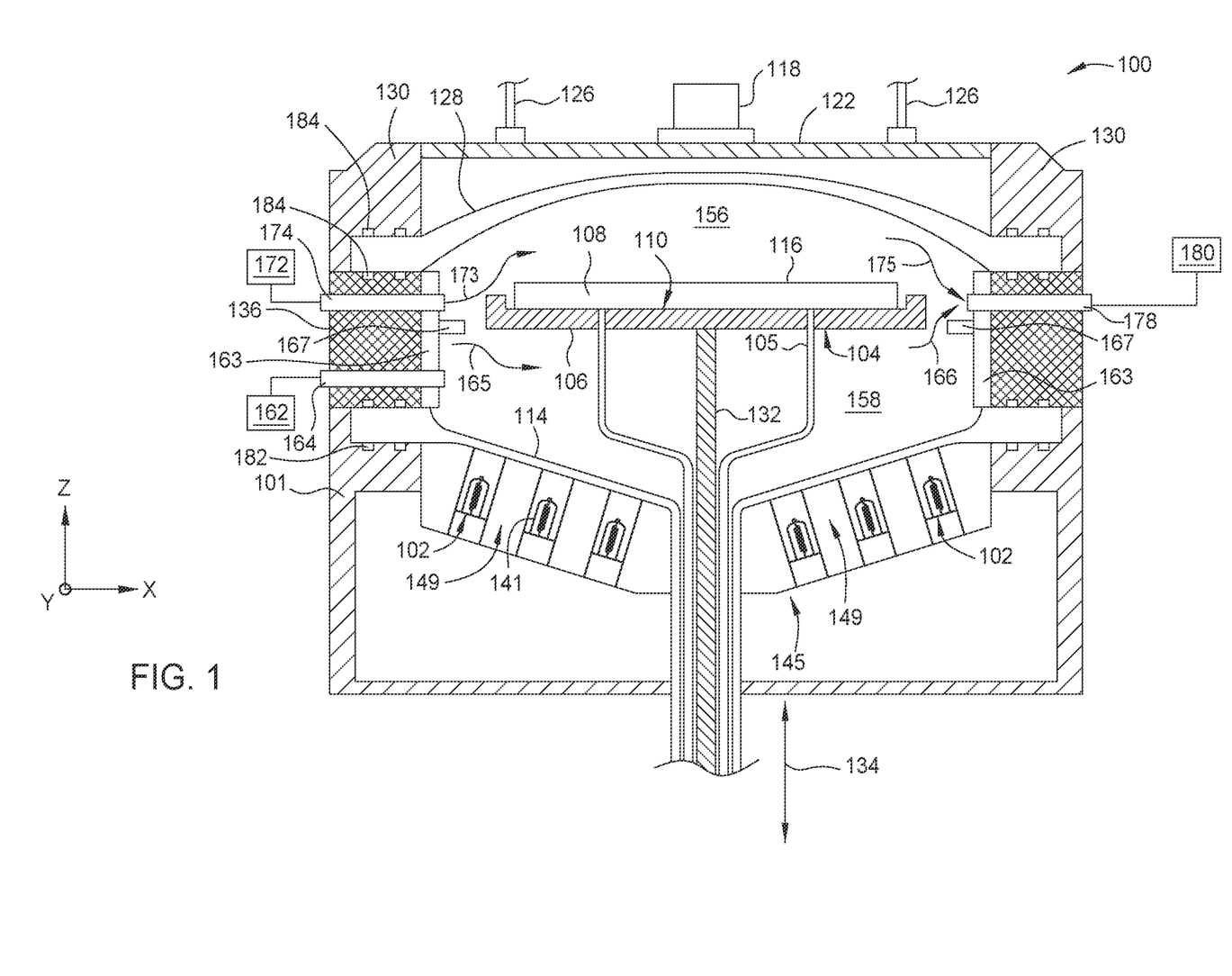
FIG. 1 is a schematic cross-sectional view of a process chamber having an exemplary flat pocket susceptor according to one or more embodiments.

FIG. 1 is a schematic cross-sectional view of an exemplary process chamber 100 that includes a flat pocket susceptor 106 as further described below. It is contemplated that while a process chamber for epitaxial process is shown and described, the susceptor of the present disclosure may also be used in other types of process chambers that are capable of providing a controlled thermal cycle that heats the substrate for processes such as, for example, thermal annealing, thermal cleaning, thermal chemical vapor deposition, thermal oxidation and thermal nitridation, regardless of whether the heating elements are provided at the top, bottom, or both of the process chamber.

The process chamber 100 and the associated hardware may be formed from one or more process-compatible materials, such as stainless steel, quartz (e.g., fused silica glass), SiC, CVD-coated SiC over graphite (30-200 microns), and combinations and alloys thereof, for example. The process chamber 100 may be used to process one or more substrates, including the deposition of a material on an upper surface of a substrate 108. The process chamber 100 includes an array of radiant heating lamps 102 for heating, among other components, a back side 104 of the susceptor 106 disposed within the process chamber 100. The susceptor 106 may be located within the process chamber 100 between an upper dome 128 and a lower dome 114. In some embodiments, an array of radiant heating lamps may be disposed over the upper dome 128 in addition to the array shown below the lower dome 114. The susceptor 106 may be a disk-like susceptor, or may be a ring-like susceptor support with a central opening, which supports the substrate from the edge of the substrate to facilitate exposure of the substrate to the thermal radiation of the lamps 102. According to one embodiment, the susceptor 106 is supported by a central shaft 132, which may directly or indirectly support the susceptor 106 as shown in FIG. 1.

The upper dome 128, the lower dome 114, and a base ring 136 that is disposed between the upper dome 128 and lower dome 114 define an internal region of the process chamber 100. The central portions of the upper dome 128 and of the lower dome 114 may be formed from an optically transparent material, such as quartz. The internal region of the process chamber 100 is generally divided into a process region 156 and a purge region 158. The substrate 108 (not to scale) can be brought into the process chamber 100 through a loading port (not shown, obscured by the susceptor 106) and positioned on a front side 110 of the susceptor 106.

According to one embodiment, the process chamber 100 also comprises a lamphead 145, which supports the array of lamps 102 and cools the lamps 102 during and/or after processing. Each lamp 102 is coupled to an electricity distribution board (not shown), which supplies electricity to each lamp 102.

A preheat ring 167 may be optionally disposed around the susceptor 106 and surrounded by a liner assembly 163. The preheat ring 167 prevents or reduces leakage of heat and or light noise from the lamps 102 to the device side 116 of the substrate 108 while providing a pre-heat zone for the process gases. The preheat ring 167 may be made from chemical vapor deposited (CVD) SiC, sintered graphite coated with SiC, grown SiC, opaque quartz, coated quartz, or any similar, suitable material that is resistant to chemical breakdown by process and purging gases.

The liner assembly 163 is sized to be nested within or surrounded by an inner circumference of the base ring 136. The liner assembly 163 shields the metallic walls of the process chamber 100 from the process gases used in processing. The metallic walls may react with the process gases and be damaged or introduce contamination into the process chamber 100. While the liner assembly 163 is shown as a single body, in embodiments of the present disclosure, the liner assembly 163 may comprise one or more liners and other components.

In one embodiment, the process chamber 100 may also include one or more optical pyrometer(s) 118, which measure temperatures within the process chamber 100 and on the surface of substrate 108. A controller (not shown) controls electricity distribution from the electricity distribution board to the lamps 102 and flows of cooling fluids within the process chamber 100. The controller controls temperatures within the process chamber 100 by varying the electrical voltage from the electrical distribution board to the lamps 102 and by varying the flows of cooling fluids.

A reflector 122 may be optionally placed outside the upper dome 128 to reflect infrared light radiating from the substrate 108 and upper dome 128 back into the process chamber 100. The reflector 122 may be secured to the upper dome 128 using a clamp ring 130. The reflector 122 may have one or more connection ports 126 connected to a cooling fluid source (not shown). The connection ports 126 may connect to one or more passages (not shown) within the reflector 122 to allow cooling fluid (e.g., water) to circulate within the reflector 122.

In one embodiment, the process chamber 100 comprises a process gas inlet 174 connected to a process gas source 172. The process gas inlet 174 may be configured to direct process gas generally across a surface of the substrate 108, such as across the device side 116. The process chamber 100 may also comprise a process gas outlet 178 located on the side of the process chamber 100 opposite the process gas inlet 174. The process gas outlet 178 is coupled to a vacuum pump 180.

In one embodiment, the process chamber 100 comprises a purge gas inlet 164 formed in the sidewall of the base ring 136. A purge gas source 162 supplies purge gas to the purge gas inlet 164. If the process chamber 100 comprises the preheat ring 167, the preheat ring 167 is disposed between the process gas inlet 174 and the purge gas inlet 164. The process gas inlet 174, purge gas inlet 164, and process gas outlet 178 are shown for illustrative purposes, and the position, size, number of gas inlets and outlets, etc. may be adjusted to facilitate a uniform deposition of material on the substrate 108.

The susceptor 106 is shown in a position to allow processing of a substrate in the process chamber. The central shaft 132 and susceptor 106 may be raised and lowered 134 by an actuator (not shown). A plurality of lift pins 105 pass through the susceptor 106. Lowering the susceptor 106 to a loading position below the processing position allows lift pins 105 to contact the lower dome 114, pass through holes in the susceptor 106, and raise the substrate 108 from the susceptor 106. A robot (not shown) then enters the process chamber 100 to engage and remove the substrate 108 though the loading port (not shown). The robot or another robot enters the process chamber through the loading port and places an unprocessed substrate on the susceptor 106. The susceptor 106 then is raised to the processing position by the actuator to place the unprocessed substrate in position for processing.

In one embodiment, processing of a substrate 108 in the process chamber 100 comprises inserting the substrate 108 through the loading port, placing the substrate 108 on the susceptor 106, raising the susceptor 106 and substrate 108 to the processing position, heating the substrate 108 by the lamps 102, flowing process gas 173 across the substrate 108, and rotating the substrate 108. In some cases, the substrate may also be raised or lowered 134 during processing.

In some aspects of the present disclosure, epitaxial processing in the process chamber 100 comprises controlling the pressure within the process chamber 100 to be lower than atmospheric pressure. In some embodiments, pressure within the process chamber 100 is reduced to be between approximately 10 Torr and 80 Torr. In some embodiments, pressure within the process chamber 100 is reduced to be between approximately 80 Torr and 300 Torr. The vacuum pump 180 is activated to reduce the pressure of the process chamber 100 before and/or during processing.

The process gas 173 is introduced into the process chamber 100 from one or more process gas inlets 174, and exits the process chamber 100 through one or more process gas outlets 178. The process gas 173 deposits one or more materials on the substrate 108 through thermal decomposition, for example, or other reactions. After depositing materials on the substrate 108, effluent (i.e., waste gases) 175 are formed from the reactions. The effluent 175 exits the process chamber 100 through the process gas outlets 178.

When processing of a substrate 108 is complete, the process chamber is purged of process gas 173 and effluent 175 by introduction of purge gas 165 (e.g., hydrogen or nitrogen) through the purge gas inlets 164. Purge gas 165 may be introduced through the process gas inlets 174 instead of, or in addition to, the purge gas inlets 164. The purge gas 165 exits the process chamber 100 through the process gas outlets 178.

Exemplary Susceptor

Figure 2A:
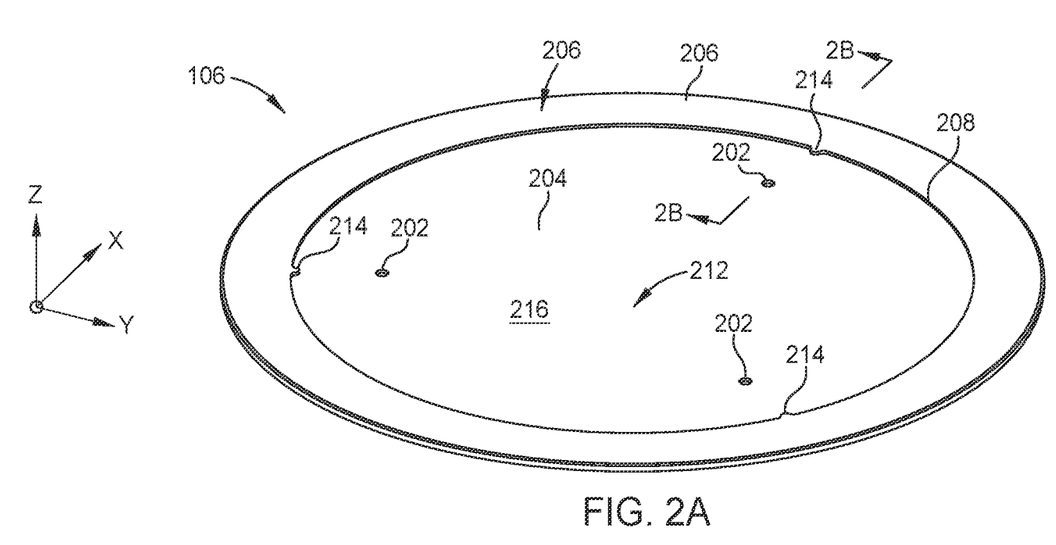
FIG. 2A is an isometric view of the exemplary susceptor of FIG. 1 according to one or more embodiments.

FIG. 2A is an isometric view of an exemplary susceptor 106 that may be used in process chamber 100 (FIG. 1) or other suitable process chambers. The susceptor 106 is a substantially circular plate divided into an inner region 204 and a rim 206 surrounding and coupled to the inner region 204. In certain embodiments, the inner region 204 is substantially parallel to the rim 206. The inner region 204 may be slightly lower than a top surface 210 of the rim 206 to form a recessed pocket 212 sized to receive a substrate. Susceptors, such as susceptor 106, are generally sized so that the substrate to be processed on the susceptor fits just inside the rim, such as the rim 206 of the susceptor 106. For example, for a 300 mm substrate, the diameter of the inner region 204 may be about just greater than the diameter of the substrate. The recessed pocket 212 prevents the substrate from slipping out during processing. A step 308 (shown in FIG. 3A) is formed at an interface between the inner region 204 and the rim 206. In one embodiment, a top surface 216 of the recessed pocket 212 may be about 0.5 mm to about 2.0 mm below the top surface 210 of the rim 206. The height of the recessed pocket 212 is variable and is determined by the thickness of the substrate to be supported by the susceptor 106. As shown in FIG. 2A, the top surface 216 of the recessed pocket 212 is substantially flat with respect to a lateral plane of the susceptor 106 (x-y plane). Alternatively, it is contemplated that the recessed pocket 212 may be slightly concave.

The susceptor 106 is provided with a plurality of bumps 214, for example 3 bumps, extending radially inward from the inner diameter 208 of the rim 206. The bumps 214 help to radially position and/or center a substrate (not shown) within the recessed pocket 212 while, at the same time, reducing a contacting surface area between the substrate and the susceptor 106 when the substrate is supported by the susceptor 106. It may be desirable to minimize and/or reduce the contacting surface area between the substrate and the susceptor 106 in order to reduce a hot spot effect caused by higher than average heat transfer to the substrate at the outer edge. In certain embodiments, the bumps 214 may be shaped and/or aligned to reduce and/or minimize the contacting surface area thereof with an outer edge of the substrate. As shown in FIG. 2A, the bumps 214 are rounded when viewed from above. However, it is contemplated that the bumps 214 may be any suitable shape when viewed from above, such as arch-shaped, rectangular-shaped, square-shaped, V-shaped, U-shaped, C-shaped, or a combination thereof. The bumps 214 may be formed of the same material as the susceptor 106, or a different material, and may be made from silicon carbide, or graphite coated with silicon carbide or glassy carbon. It is contemplated that the substrate may contact one or more of the bumps 214 during processing without contacting an inner diameter 208 of the rim 206. In one embodiment, for a 300 mm substrate (150 mm radius), a radius of the recessed pocket 212 measured from a center axis of the susceptor 106 to an inner edge of each bump 214 is slightly larger than the radius of the substrate. Therefore, the substrate may move slightly (in the x-y plane) between the bumps 214 and relative to the inner diameter 208 of the rim 206. However, the exact positioning of the substrate is less important using susceptor embodiments disclosed herein because the effect of substrate position on heat transfer is reduced compared to susceptor designs with a greater hot spot effect. In other words, substrate position sensitivity is reduced in the susceptor embodiments disclosed herein.

The inner region 204 is provided with a number of through-holes 202, for example 3 through-holes, corresponding to the placement of the lift pins 105 (as shown in FIG. 1). The through-holes 202 allow the lift pins 105 to pass through the susceptor 106 to raise or lower the substrate from the susceptor 106. The through-holes 202 may be arranged at 120 degree intervals in a circumferential direction.

Figure 2B:
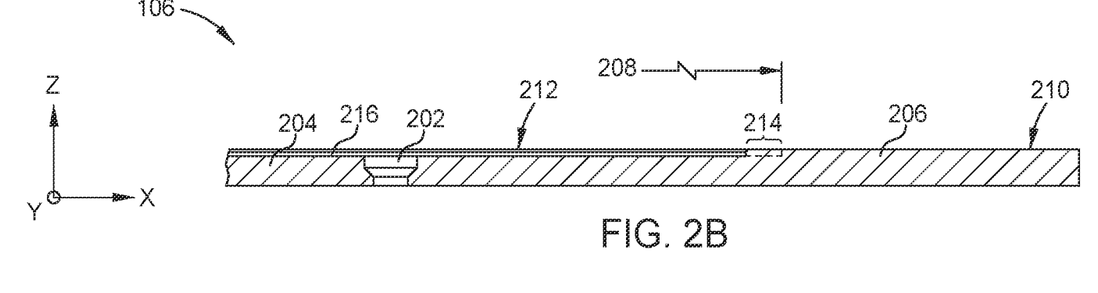
FIG. 2B is a partial cross-sectional view of the susceptor of FIG. 2A according to one or more embodiments.

FIG. 2B is a partial cross-sectional view of the susceptor 106 taken along section line 2B-2B of FIG. 2A according to one or more embodiments. The cross-sectional view shows one of the bumps 214 extending radially inward from the inner diameter 208 of the rim 206 toward the inner region 204. A lateral dimension of each of the bumps 214 measured radially within the lateral plane of the susceptor 106 (x-y plane) is about 2 mm to about 4 mm, such as about 3 mm. The cross-sectional view also shows one of the through-holes 202 oriented orthogonally to the lateral plane (x-y plane) of the susceptor 106 and extending therethrough from the back side of the susceptor 106 to the top surface 216 of the recessed pocket 212.

Figure 3A:
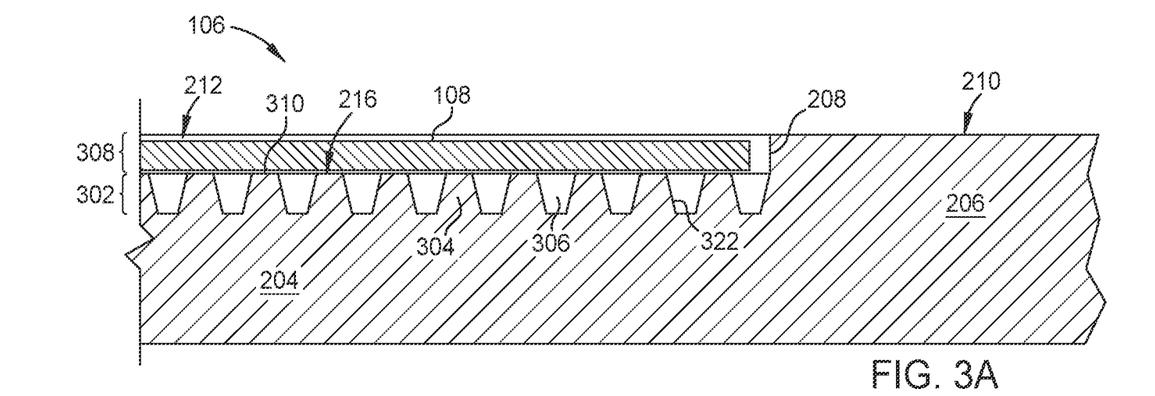
FIG. 3A is an enlarged partial cross-sectional view of the exemplary susceptor of FIG. 1 according to one or more embodiments.
Figure 3B:
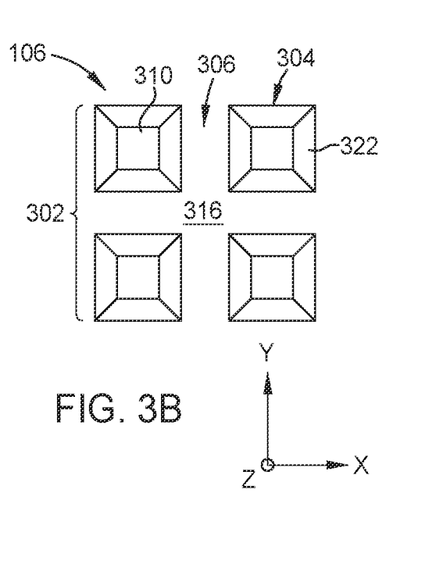
FIG. 3B is a top view of a portion of the susceptor of FIG. 3A according to one or more embodiments.

FIG. 3A is an enlarged partial cross-sectional view of the exemplary susceptor 106 of FIG. 1 according to one or more embodiments, which may be combined with other embodiments disclosed herein. The susceptor 106 has a pattern 302 formed on the top surface 216 of the recessed pocket 212. Although FIG. 3A only shows the profile of the pattern 302 along the x-axis, it is contemplated that the pattern features are arranged in a grid which is uniform across the top surface 216 (shown in top view of FIG. 3B). In certain embodiments, the pattern 302 has a grid layout including a plurality of support features, such as truncated pyramidal supports 304, separated by a plurality of channels, such as V-shaped channels 306. Each support feature has a substrate contact surface 310 defined at the top surface 216. The substrate contact surface 310 is substantially flat and parallel with respect to a lateral plane of the susceptor 106 (x-y plane). The substrate contact surfaces 310 are coplanar with each other for collectively contacting and supporting the substrate 108. As shown in FIG. 3B, because the supports 304 are pyramidal, each substrate support 304 has four sidewalls, and the V-shaped channels are oriented 90° apart.

In general, the pattern is designed to improve heat transfer uniformity from the susceptor to the substrate while, at the same time, facilitating venting of exhaust gases, for example air, from underneath the substrate. In certain embodiments, the support features are evenly distributed and the substrate contact surfaces are uniformly spaced to provide uniform direct contact between the susceptor and the substrate, resulting in greater uniformity of conductive heat transfer therebetween. In certain embodiments, it may be desirable to increase the number of contact points between the susceptor and the substrate while minimizing the contacting surface area. This may be accomplished by reducing the size of each substrate contact surface as described in more detail below.

The number and/or spacing between channels may be selected to enact rapid gas exhaust from the recessed pocket. In certain embodiments, uniform spacing of the channels improves venting by lowering the total resistance to gas flow. Without channels, gases may become trapped, for example, when the substrate is initially positioned on the susceptor, during processing, or the like. If the gases remain trapped, for example, during a rapid pressure decrease in chamber pressure, the trapped gases may expand against the reduced chamber pressure causing the substrate to lift, shift, or otherwise move from its location on the susceptor.

Figure 3C:
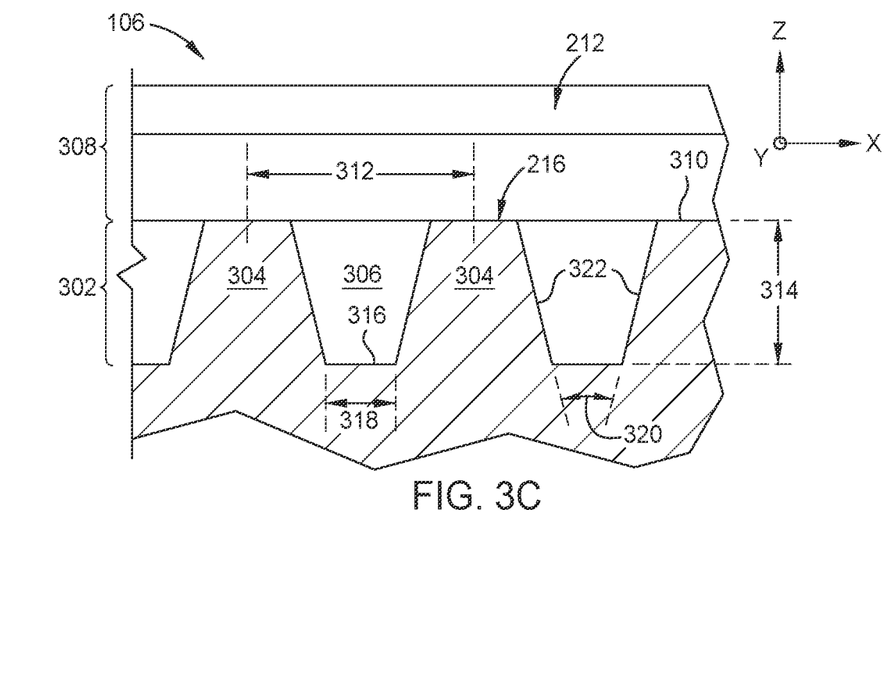
FIG. 3C is an enlarged cross-sectional view of a portion of the susceptor of FIG. 3A according to one or more embodiments.

The cross-sectional view of the pattern 302 is shown in more detail in FIG. 3C. Certain dimensions of the pattern 302 are selected to provide the advantages outlined above. For example, a lateral distance (i.e., pitch) 312 between adjacent support features, such as the pyramidal supports 304 of the susceptor 106, may be about 0.5 mm to about 3 mm, such as about 1 mm to about 2 mm, such as about 1 mm, such as about 2 mm. The lateral distance 312 corresponds to the grid size of the pattern measured along the x-axis from center-to-center of adjacent support features (e.g., a 1 mm grid or a 2 mm grid). The lateral distance 312 along the y-axis may be the same or different than the lateral distance 312 along the x-axis. In the example depicted in FIGS. 3B-3C, the lateral distances 312 are the same in both the x- and y-axes. In certain embodiments, a vertical height 314 of the support features, such as the pyramidal supports 304 of the susceptor 106, may be about 0.25 mm to about 2 mm, such as about 0.5 mm. The vertical height 314 is measured along the z-axis from the top surface 216 to a bottom surface 316 of the channels. In certain embodiments, it may be desirable to increase support feature height to improve gas flow while, at the same time, maintaining the support feature height at a minimum to prevent cold spots from forming between the susceptor and the substrate.

In certain embodiments, a lateral width 318 of the channels, such as the V-shaped channels 306 of the susceptor 106, may be about 0.5 mm to about 10 mm. The lateral width 318 corresponds to the width of the bottom surface 316 of each channel measured along the x- or y-axis between adjacent support features. In certain embodiments, an angle 320 of the channels, such as the V-shaped channels 306 of the susceptor 106, measured between sidewalls 322 of adjacent support features may be about 5° to about 60°. The angle 320 may be selected to balance the reflection of radiant heat from the lamps 102 for better temperature uniformity. In other words, because distribution of reflected and/or emitted radiation from the inner region 204 of the susceptor 106 is directional, the angle 320 can be determined such that radiant heat transfer from the susceptor 106 to the substrate 108 is increasingly isotropic (i.e., has the same value when measured in different directions). It will be appreciated that the dimensions described above also define the size of each substrate contact surface 310 along the top surface 216. It may be desirable to reduce a contacting surface area between the substrate contact surfaces 310 and the substrate 108 to allow for a higher percentage of the heat transfer to be radiant heat resulting in improved temperature control and improved thermal treatment and/or deposition on the substrate. In certain embodiments, a ratio of the total combined surface area of the substrate contact surfaces 310 to the total surface area of the recessed pocket 212 inside the inner diameter 208 of the rim 206 measured in the x-y plane is about 0.5% to about 5%, such as about 0.5% to about 3%, such as about 1% to about 2%. Beneficially, an ultra-low surface area ratio of the substrate contact surfaces 310, such as about 5% or less, lowers the ratio of conduction to radiation heat transfer from the susceptor 106 to the substrate 108 which improves temperature uniformity and consequently produces better processing results. Because the ratio of conduction to radiation heat transfer is positively correlated to the surface area ratio described above, further lowering of the surface area ratio can further reduce the portion of conductive heat transfer with positive impacts on processing results. Furthermore, susceptor embodiments designed with ultra-low surface area ratios beneficially provide suitable mechanical support to the substrate 108 to prevent warping while, at the same time, increasing randomly oriented radiant heat emission and reducing temperature variation between adjacent support features based on precisely determined pitch between adjacent support features.

Figure 4:
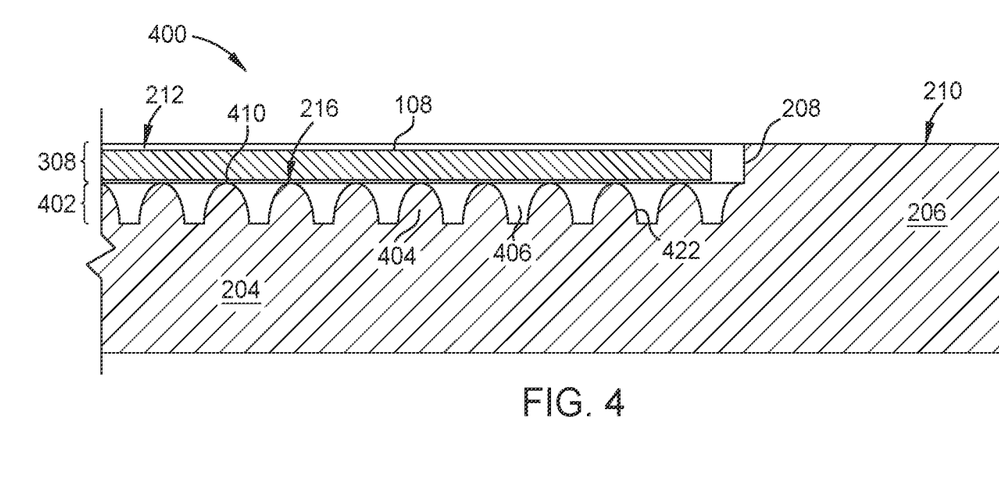
FIG. 4 is a partial cross-sectional view of another exemplary susceptor that may be used in the process chamber of FIG. 1 according to one or more embodiments.

FIG. 4 is a partial cross-sectional view of a susceptor 400 that may be used in place of the susceptor 106 in the process chamber 100 of FIG. 1 according to one or more embodiments, which may be combined with other embodiments disclosed herein. In FIG. 4, the supports 404 and channels 406 of the pattern 402 are rounded, or curved. In some other embodiments (not shown), it is contemplated that the supports 404 may be any curved shaped, such as truncated cones, truncated spherical or elliptical forms, or a combination thereof. The curved supports 404 have smooth sidewalls 422 which produce more randomly oriented thermal radiation compared to flat-faced sidewalls. Therefore, the curved supports 404 can further improve heat transfer uniformity beyond what has been discussed so far. The curved substrate contact surfaces 410 of the pattern 402 decrease the total contacting surface area between the substrate contact surfaces 410 and the substrate 108 compared to the flat substrate contact surfaces 310 of the pattern 302. The reduced contacting surface area of the susceptor 400 compared to other susceptor embodiments disclosed herein may further improve thermal uniformity when processing a substrate by lowering conductive heat transfer. In certain embodiments, a total contacting surface area between the substrate contact surfaces 410 and the substrate 108 (measured as a fraction of the surface area in the x-y plane of the recessed pocket 212 inside the inner diameter 208 of the rim 206) is about 0.1% to about 5%, such as about 0.1% to about 3%, such as about 0.5% to about 2%.

Figure 5A:
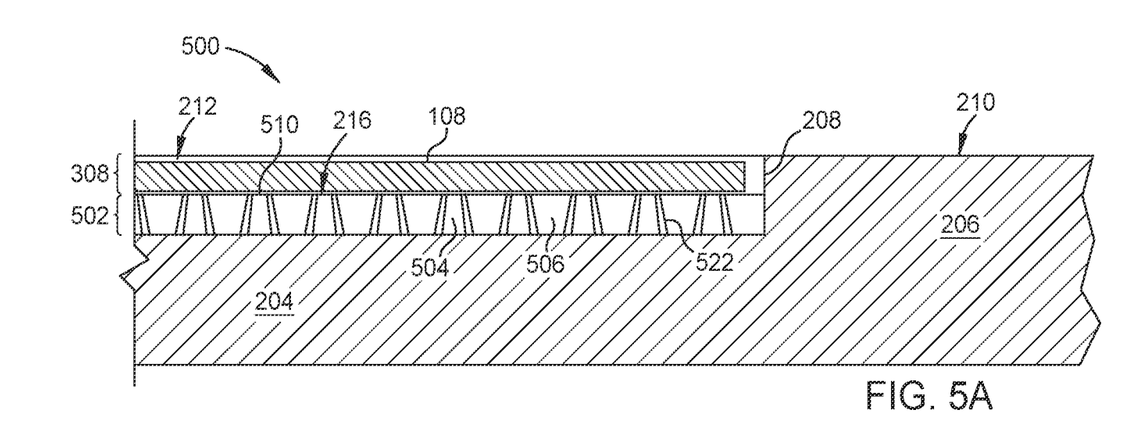
FIG. 5A is a partial cross-sectional view of yet another exemplary susceptor that may be used in the process chamber of FIG. 1 according to one or more embodiments.
Figure 5B:
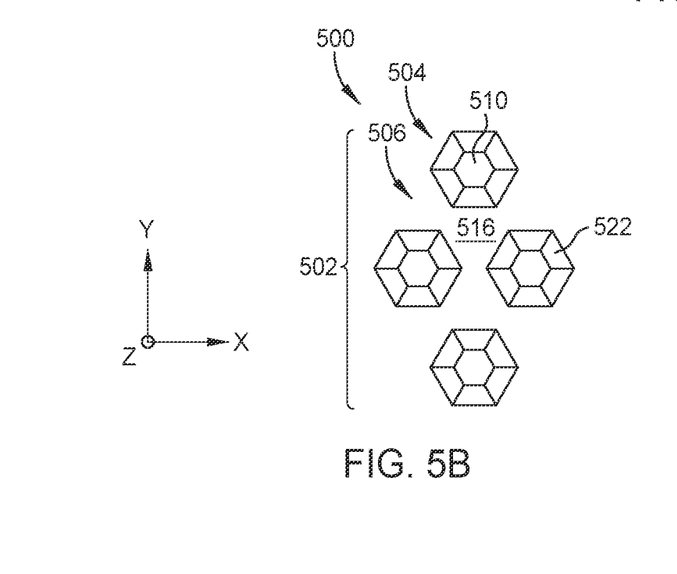
FIG. 5B is a top view of a portion of the susceptor of FIG. 5A according to one or more embodiments.

FIG. 5A is a partial cross-sectional view of a susceptor 500 that may be used in place of the susceptor 106 in the process chamber 100 of FIG. 1 according to one or more embodiments, which may be combined with other embodiments disclosed herein. FIG. 5B is a top view of a portion of the susceptor 500. In FIGS. 5A-5B, the supports 504 and channels 506 of the pattern 502 are hexagonal when viewed from above. The substrate contact surfaces 510 of the pattern 502 are substantially flat and parallel with respect to a lateral plane of the susceptor 500 (x-y plane) and substantially parallel to a bottom surface 516 of the channels 506, similar to the substrate contact surfaces 310 of the pattern 302. The substrate contact surfaces 510 are also coplanar with each other for collectively contacting and supporting the substrate 108. However, in contrast to the pattern 302, each support 504 of the pattern 502 has six sidewalls 522 instead of four with an associated increased in radiative surface area. The increased radiative surface area of the hexagonal supports 504 may improve heat transfer uniformity compared to pyramidal supports 304 having the same contacting surface area. In contrast to the pattern 302, the channels 506 are oriented 60° apart instead of 90° apart. In certain embodiments, a total contacting surface area between the substrate contact surfaces 410 and the substrate 108 (measured as a fraction of the surface area in the x-y plane of the recessed pocket 212 inside the inner diameter 208 of the rim 206) is about 0.1% to about 5%, such as about 0.1% to about 3%, such as about 0.5% to about 2%. In some other embodiments (not shown), it is contemplated that the support features may be any suitable shape when viewed from above, such as rectangular, rhombus, square, triangular, rounded, hexagonal, other shapes, or a combination thereof. In certain embodiments which may be combined with other embodiments, the support features may be tetrahedral pyramids, hemispherical, other rounded shapes, other 3-dimensional shapes, or a combination thereof. Any of the support features described above may be truncated to form a flat and parallel support surface across the support features.

The susceptor embodiments described herein allow for more uniform temperature control of substrates during thermal processes, such as epitaxy. The temperature control is improved near the outer edge of the substrate by reducing the surface area of the outer edge contacting the susceptor, which reduces edge thermal peak and the amount of conductive heat transferred from the susceptor to the substrate at the outer edge. The embodiments disclosed herein reduce and/or minimize contacting surface area between the susceptor and the outer edge of the substrate by providing very few centering bumps, for example 3 bumps, around the circumference of the susceptor.

In general, flat pocket susceptors increase conductive heat transfer compared to susceptors which support the substrate only near the outer edge. Because conductive heat transfer between the susceptor and the substrate is more difficult to control than radiant heat transfer, reducing and/or minimizing direct contact between the susceptor and the back side of the substrate is desirable. The susceptor embodiments disclosed herein reduce direct contact between the susceptor and the back side of the substrate by providing a patterned surface having a plurality of support features. The direct contact can be reduced based on the design of the pattern including the layout of the support features and the dimensions of the support features. Reducing the surface area of the substrate contacting the susceptor allows for a higher percentage of the heat transfer to be radiant heat resulting in improved temperature control and improved thermal treatment and/or deposition on the substrate. The susceptor embodiments disclosed herein also improve gas exhaust by including venting channels at regular intervals within the recessed pocket of the susceptor.

Exemplary Method of Susceptor Fabrication

Figure 6:
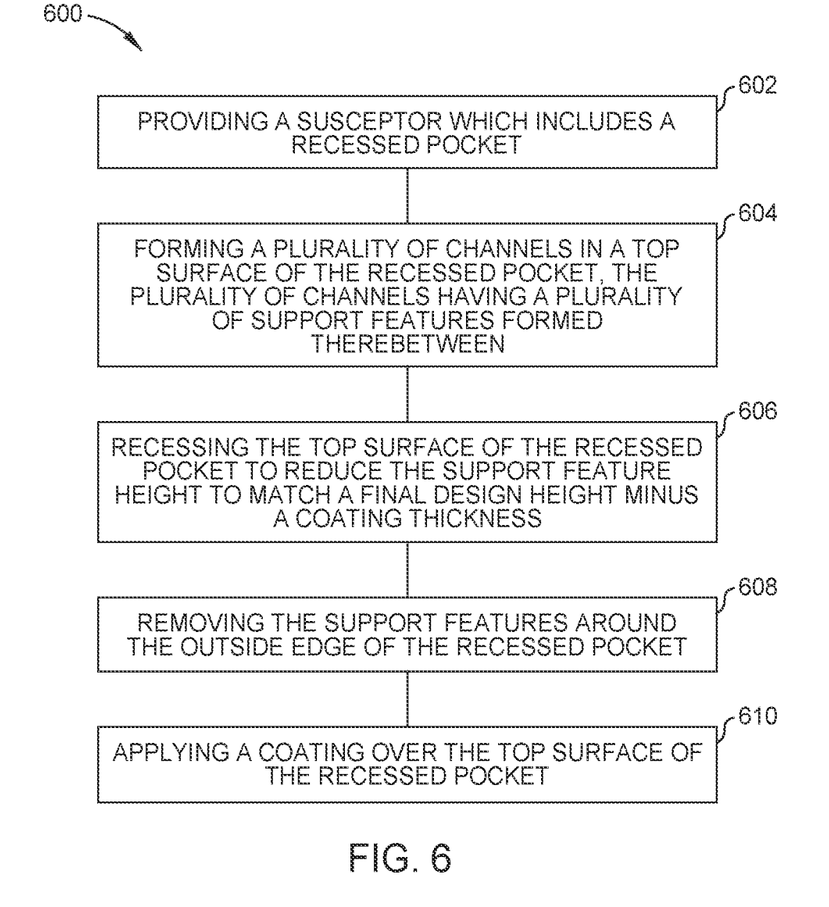
FIG. 6 is a diagram illustrating a method of fabricating a susceptor according to one or more embodiments.

FIG. 6 is a diagram illustrating a method 600 of fabricating a susceptor according to one or more embodiments, which may be combined with other embodiments disclosed herein. At operation 602, a susceptor is provided which includes a recessed pocket, such as the susceptor 106 having the recessed pocket 212 shown in FIGS. 2A-2B, or other suitable susceptor.

At operation 604, a plurality of channels are formed in a top surface of the recessed pocket, the plurality of channels having a plurality of support features formed therebetween. For example, in the embodiment shown in FIGS. 3A-3C, a cutting tool (e.g., V-shaped tooling) may be used to make a first plurality cuts in the x-direction which are spaced-apart by the lateral width 312. The susceptor 106 may then be rotated 90° relative to the cutting tool and the cutting tool used to make a second plurality of cuts substantially orthogonal to the first plurality of cuts (i.e., in the y-direction) which are also spaced-apart by the lateral width 312. In the embodiments shown in FIG. 4, other tooling or more complex machining methods may be used to form the pattern 402 having curved supports 404. In the embodiment shown in FIGS. 5A-5B, the susceptor 500 may be rotated by 60° before making the second plurality of cuts and rotated by another 60° before making a third plurality of cuts.

At operation 606, the top surface of the recessed pocket is recessed to reduce the support feature height to match a final design height minus a coating thickness. At operation 608, the support features around the outside edge of the recessed pocket may be optionally removed. In certain embodiments, the support features are machined using a flat mill bit. At operation 610, a coating may be applied over the top surface of the recessed pocket. In certain embodiments, the coating comprises SiC deposited by chemical vapor deposition (CVD). The susceptor is fabricated such that application of the coating brings the dimensions of the pattern in line with the final design dimensions, such as the dimensions outlined above with respect to FIG. 3C.

Although the foregoing embodiments have been described using circular geometries (e.g., circular plate, rim, etc.) to be used on semiconductor "substrates," the embodiments disclosed can be adapted to conform to different geometries.

While the foregoing is directed to embodiments of the present disclosure, other and further embodiments of the disclosure may be devised without departing from the basic scope thereof, and the scope thereof is determined by the claims that follow.

What is claimed is:

1. A susceptor, comprising:
an inner region having a pattern formed in a top surface thereof, the pattern comprising a plurality of substrate support features, wherein adjacent substrate support features of the plurality of substrate support features are separated by a venting channel of a plurality of venting channels;
a rim surrounding and coupled to the inner region, wherein the inner region is recessed relative to the rim to form a recessed pocket configured to receive a substrate; and
a plurality of bumps extending radially inward from an inner diameter of the rim, the plurality of bumps configured to contact an outer edge of a substrate supported by the plurality of substrate support features for positioning the substrate within the recessed pocket.

2. The susceptor of claim 1, wherein each substrate support feature comprises a substrate contact surface along the top surface of the inner region, and wherein a surface area ratio of the substrate contact surfaces is about 5% or less.

3. The susceptor of claim 1, wherein a shape of the plurality of bumps when viewed from above comprises at least one of rounded, arch-shaped, rectangular-shaped, square-shaped, V-shaped, U-shaped, C-shaped, or a combination thereof.

4. The susceptor of claim 1, wherein the pattern comprises at least one of a uniform or non-uniform pitch across the top surface.

5. The susceptor of claim 1, wherein each substrate support feature comprises a substrate contact surface along the top surface of the inner region, and wherein the substrate contact surfaces are substantially flat with respect to a lateral plane of the susceptor.

6. The susceptor of claim 5, wherein the substrate contact surfaces are substantially coplanar with each other for collectively contacting and supporting a substrate.

7. The susceptor of claim 1, wherein the plurality of substrate support features are pyramidal.

8. The susceptor of claim 1, wherein the plurality of substrate support features are hexagonal when viewed from above.

9. The susceptor of claim 1, wherein a lateral distance defining a pitch between adjacent support features is about 0.5 mm to about 3 mm.

10. A method of fabricating a susceptor, comprising:
forming a plurality of channels in a top surface of a recessed pocket of the susceptor, the plurality of channels having a plurality of support features formed therebetween, wherein forming the plurality of channels and the plurality of support features comprises:
making a first plurality of cuts in a first direction using a cutting tool;
rotating the susceptor relative to the cutting tool by a first angle; and
making a second plurality of cuts in a second direction using the cutting tool, the second direction spaced from the first direction by the first angle; and
recessing a top surface of the recessed pocket.

11. The method of claim 10, wherein the first angle is about 90°, and wherein the support features are pyramidal.

12. The method of claim 10, further comprising:
after making the second plurality of cuts, rotating the susceptor relative to the cutting tool by a second angle, wherein the second angle is substantially equal to the first angle; and
making a third plurality of cuts in a third direction using the cutting tool, the third direction spaced from the second direction by the second angle.

13. The method of claim 12, wherein the first and second angles are about 60°, and wherein the support features are hexagonal when viewed from above.

14. The method of claim 10, further comprising removing the support features around an outside edge of the recessed pocket.

15. The method of claim 10, further comprising applying a coating over the top surface of the recessed pocket.

16. The method of claim 10, wherein each of the first plurality of cuts in the first direction and each of the second plurality of cuts in the second direction are spaced apart by a distance of about 0.5 mm to about 3 mm.

17. A susceptor, comprising:
an inner region having a pattern formed in a top surface thereof, the pattern comprising a plurality of substrate support features, wherein adjacent substrate support features of the plurality of substrate support features are separated by a venting channel of a plurality of venting channels, wherein each substrate support feature comprises a substrate contact surface along the top surface of the inner region, and wherein the substrate contact surfaces are substantially flat with respect to a lateral plane of the susceptor;
a rim surrounding and coupled to the inner region, wherein the inner region is recessed relative to the rim to form a recessed pocket configured to receive a substrate; and
a plurality of bumps extending radially inward from an inner diameter of the rim, the plurality of bumps configured to contact an outer edge of a substrate supported by the plurality of substrate support features for positioning the substrate within the recessed pocket.

18. The susceptor of claim 17, wherein the substrate contact surfaces are substantially coplanar with each other for collectively contacting and supporting a substrate.

19. The susceptor of claim 17, wherein a shape of the plurality of substrate support features is at least one of square or hexagonal when viewed from above.

* * * * *